United States Patent [19]

Hietala et al.

[11] Patent Number: 5,070,310
[45] Date of Patent: Dec. 3, 1991

[54] MULTIPLE LATCHED ACCUMULATOR FRACTIONAL N SYNTHESIS

[75] Inventors: Alexander W. Hietala, Cary; Duane C. Rabe, Rolling Meadows, both of Ill.

[73] Assignee: Motorola, Inc., Schaumburg, Ill.

[21] Appl. No.: 576,342

[22] Filed: Aug. 31, 1990

[51] Int. Cl.$^5$ .......................... H03C 3/09; H03L 7/197
[52] U.S. Cl. .................................. 331/1 A; 331/16;
331/25; 332/127; 375/120; 377/48; 455/76;
455/183; 455/260
[58] Field of Search .......................... 331/1 A, 16, 25;
332/127, 128; 328/14, 155; 377/48; 375/120;
455/76, 119, 183, 260

[56] References Cited

U.S. PATENT DOCUMENTS

| | | | |
|---|---|---|---|
| 3,928,813 | 12/1975 | Kingsford-Smith | 331/1 A |
| 4,179,670 | 12/1979 | Kingsbury | 331/10 |
| 4,204,174 | 5/1980 | King | 331/10 |
| 4,609,881 | 9/1986 | Wells | 331/1 A |
| 4,758,802 | 7/1988 | Jackson | 331/10 |
| 4,800,342 | 1/1989 | Jackson | 331/10 |
| 4,810,977 | 3/1989 | Flugstad et al. | 455/113 X |
| 4,815,018 | 3/1989 | Reinhardt et al. | 364/701 |
| 4,816,774 | 3/1989 | Martin | 331/1 A |

FOREIGN PATENT DOCUMENTS 2091960  8/1982  United Kingdom .

OTHER PUBLICATIONS

Brewerton et al., "Defining the Elements of Good Design", Microwaves and RF, Jun. 1984, pp. 79-85, 124.

Primary Examiner—Siegfried H. Grimm
Attorney, Agent, or Firm—Raymond A. Jenski; Rolland R. Hackbart

[57] ABSTRACT

A multiple latched accumulator fractional-N synthesizer for use in digital radio transceivers is disclosed. The divisor of the frequency divider (103) of the synthesizer is varied with time by the summation of accumulator carry output digital sequences which result in frequency increments equal to a fraction of the reference frequency. The accumulators (615, 617) are latched such that upon the occurrence of a clock pulse, data is transferred through each accumulator one clock pulse step at a time, such that the delay through the system is equal to that of only one accumulator. The carry outputs of each accumulator are coupled through delays (645, 647, 649, 631, 633) equal to one less delay than the number of accumulators and added (635) such that all higher order accumulator carry outputs add to a net summation of zero so as to not upset the desired fractional setting of the first accumulator.

14 Claims, 6 Drawing Sheets

MULTIPLE LATCHED ACCUMULATOR FRACTIONAL N SYNTHESIS

BACKGROUND OF THE INVENTION

This invention relates generally to frequency synthesizers and more particularly to a fractional-N frequency synthesizer employing more than one accumulator in a latched configuration, such that data need not "ripple" through more than one accumulator. The latched configuration operates synchronously and enables the system to operate at higher frequencies thereby reducing spurious signals. Reference is made to copending U.S. Pat. application Ser. Nos. 516,993, "Multiaccumulator Sigma-Delta Fractional-N Synthesis", filed in behalf of Hietala et al., on Apr. 30, 1990 and 516,897, "Fractional N/M Synthesis", filed in behalf of Black et al. on Apr. 30, 1990, each assigned to the assignee of the present invention. Reference is also made to U.S. Pat. application Ser. No. 576,333, "Latched Accumulator Fractional-N Synthesis with Residual Error Reduction", filed on the same date herewith in behalf of Hietala et al.

Phase-locked loop (PLL) frequency synthesis is a well known technique for generating one of many related signals from a voltage controlled oscillator (VCO). In a single loop PLL, an output signal from the VCO is coupled to a programmable frequency divider which divides by a selected integer number to provide a frequency divided signal to a phase detector which compares the frequency divided signal to a reference signal from another fixed frequency oscillator which, often, is selected for stability of frequency over time and environmental changes. Any difference in phase between the frequency divided signal and the reference signal is output from the phase detector, coupled through a loop filter, and applied to the VCO in a manner which causes the output signal from the VCO to change in frequency such that the phase error between the frequency divided signal and the reference signal is minimized. Since the programmable divider divides by integers only, the output frequency step size is constrained to be equal to the reference signal frequency. With the single loop PLL, an engineering compromise must be struck between the competing requirements of loop lock time, output frequency step size, noise performance, and spurious signal generation.

In order to overcome the limitations of the single loop PLL, programmable frequency dividers capable of dividing by non-integers have been developed. Output frequency step sizes which are fractions of the reference signal frequency are obtained while maintaining a high reference frequency and wide loop bandwidth. A discussion of fractional-N synthesis may be found in U.S. Pat. No. 4,816,774. As described therein, two accumulators are employed to simulate the performance of fractional synthesis of the switching between different integer values of divisors without the attendant spurious signals generated by such switching. The two accumulator technique acts to reduce the unwanted spurious signals by cancellation and loop filter rejection.

The reference signal frequency for the fractional-N frequency synthesizer is, therefore, determined by the step size of the VCO output frequency multiplied by the denominator of the programmable divider divisor. Fractional-N synthesis allows the use of a reference frequency which is much higher than the actual channel spacing and allows designs to use wider bandwidths due to the reduction of low frequency spurious outputs. Wider bandwidths allow fast lock times and the possibility of wideband modulation applied to the reference input or the fractional division scheme.

Unfortunately, the system is not perfect and generates some spurious signals output at a frequency equal to the channel spacing. The desired signal output purity is better than the no-fractional system, but by itself may still be insufficient for some high quality systems.

In order to minimize the effects of this spurious output, two accumulator fractional-N synthesis systems have been developed which spread out the spurious signals to frequencies at which filtering is inexpensive and simple. By using systems with more than two accumulators this benefit can be dramatically increased.

The present multiple accumulator systems all have a drawback in that the accumulator "ripple" the data. In other words, on every clock pulse the data must act on the entire digital network structure. This results in a relatively low upper frequency limit of operation for a multiple accumulator system due to propagation delays in the digital circuitry used to build the system.

Figure 1:
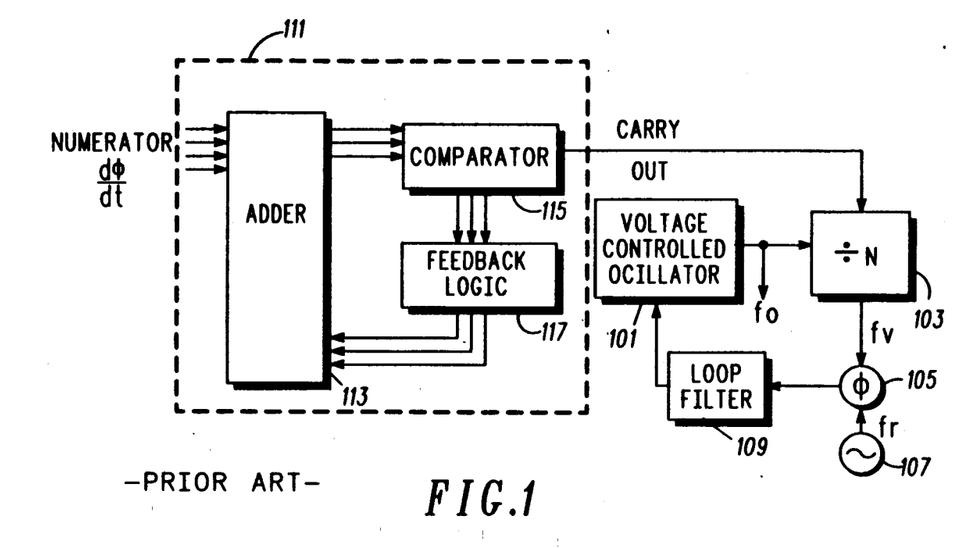
FIG. 1 is a block diagram of a first order fractional-N synthesizer.

The basic structure of a one-accumulator fractional N system is shown in the block diagram of FIG. 1. A VCO 101 generates an output signal which, typically is coupled to a programmable frequency divider 103 which has an output to a phase detector ($\phi$) 105. The control input is a summation of a coarse channel setting and the output of the digital network which provides the fractional part of the division. The phase detector 105 conventionally compares the phase of the divided frequency, $f_v$, to the phase of the reference signal frequency $f_r$ output from a reference oscillator 107 to produce a signal which is applied to a loop filter 109 and subsequently to the VCO 101 to phase-lock the VCO output signal.

The selection of the divisor value of variable frequency divider 103 is made by digital network 111 which, in previously known implementations such as described in Z-transform equivalent in U.S. Pat. No. 4,758,802, comprises a conventional adder 113, a comparator 115 (which produces a "carry out" signal when the input to the comparator 115 exceeds a given numerical value), and feedback logic 117 which substracts the denominator (if a carry output occurs) from the digital number representation output from adder 113 and comparator 115 before applying the digital number representation to the adder 113. A second digital number representation, which in a fractional-N synthesizer is the digital equivalent of the first differential of the offset phase with respect to time (the offset frequency), is applied to another input of the digital network 111. The overall effect of the digital network 111 is to integrate the differential phase and to apply to the PLL a control signal (in the form of a carry-out digital signal) which is a first order equivalent of the phase offset. The adder 113 sums the previous contents of the adder 113 with a $d\phi/dt$ (a numerator) on each occurrence of the reference frequency signal $f_r$. As described in U.S. Pat. No. 4,816,774, the adder 113 output is compared to a number (a denominator of a desired fractional part of the divisor when the divisor of frequency divider 103 is expressed as a sum of a whole number and a $$\frac{\text{numerator}}{\text{denominator}}).$$

If the contents of adder 113 exceed the denominator then the carry output is set true and the contents of the adder is reduced by the denominator in feedback logic 117 before the next reference pulse occurs.

As an example, assume the denominator is 13 and the numerator is 1. On every thirteenth reference pulse the adder 113 exceeds the denominator and generates a carry output which will increase the divisor of the frequency divider 103 by one for one reference signal, $f_r$, pulse. This removes one pulse from the VCO 101 output signal and thus reduces the accumulated phase error by 360 degrees. This corresponds to a 1/13 division added to the nominal loop division number.

Figure 2:
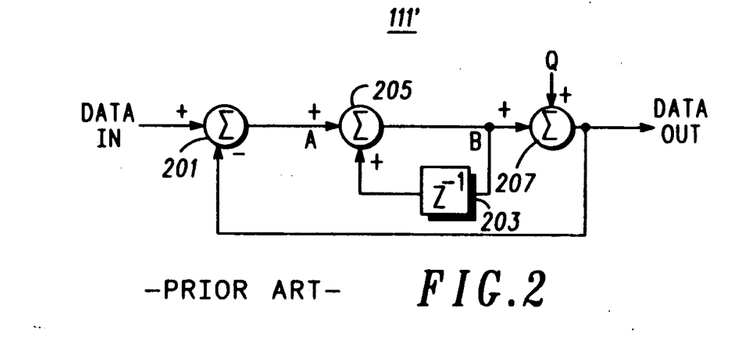
FIG. 2 is a Z-transform diagram equivalent of the digital network in FIG. 1.

Shown in the Z-transform diagram of FIG. 2, is a Z-transform equivalent digital network 111' of this one accumulator system consistent with that disclosed in U.S. Pat. No. 4,758,802. The Z-transform equation for the single accumulator system is:

$$DO = Q\frac{(1-z^{-1})}{(2-z^{-1})} + DI\frac{1}{(2-z^{-1})}$$

The Z-transform adder 201 is fed from the numerator (minus the denominator if an overflow occurs) and the previous adder contents represented by a $z^{-1}$ (delay) block 203, 205. The comparison is considered to be a digital slicer with quantization error Q added at 207. The output from adder 207 is the digital number fed back to adder 201 and the carry out signal is taken as the output signal. For Z-transform analysis, however, no difference need be made between the output and the feedback signals.

At point B an equation can be written as follows.

$$B(z) = B(z)z^{-1} + A(z) \text{ or } B(z) = A(z)/(1-z^{-1})$$

But $$\text{Data out} = B(z) + Q \text{ and } A(z) = \text{Data in} - B(z) - Q$$

Substituting this in and solving for B(z) then:

$$B(z) = \text{Data in}/(2-z^{-1}) - Q/(2-z^{-1})$$

And solving for Data out:

$$\text{Data out} = \text{Data in}/(2-z^{-1}) + Q(1-z^{-1})/(2-z^{-1})$$

This equation may now be converted to the frequency domain (Note that "v" is frequency normalized to the folding frequency:

$$\left|\frac{\text{Data Out}}{\text{Data In}}\right| = \frac{1}{\sqrt{5 - 4\cos(\pi v)}}$$

$$\left|\frac{\text{Data Out}}{Q}\right| = \sqrt{\frac{2 - 2\cos(\pi v)}{5 - 4\cos(\pi v)}}$$

Thus, the data into into adder 201 is slightly low pass filtered and the quantization noise introduced by the digital network 111' is high pass filtered. The high pass filtering of the quantization noise has the effect of reducing the spurious signals occurring at the frequency of the channel to channel frequency spacing of the transceiver if the spurious occurs at a frequency much below the corner of the high pass. By selecting a PLL response with a low pass corner frequency much lower in frequency than the high pass corner it is possible to reject almost all the noise. In a single accumulator system, the high pass roll-off is 20 dB/decade. Thus the reference frequency must be large to push the high pass corner to large frequencies if sufficient noise suppression is to be obtained. (Or the PLL low pass must be very low in frequency and thus lose the benefit of wide bandwidth.)

To improve the high pass filtering of the basic fractional-N structure, it has been known to use fractional-N synthesis for systems using more than one accumulator. A two accumulator fractional-N synthesizer is disclosed in U.S. Pat. No. 4,204,174. Also, an example of a multiaccumulator fractional-N synthesizer is shown in the block diagram of FIG. 3, where the single digital network 111 of FIG. 1 is augmented by additional accumulators, in this instance, accumulator 303, accumulator 305, and accumulator 307.

Figure 3:
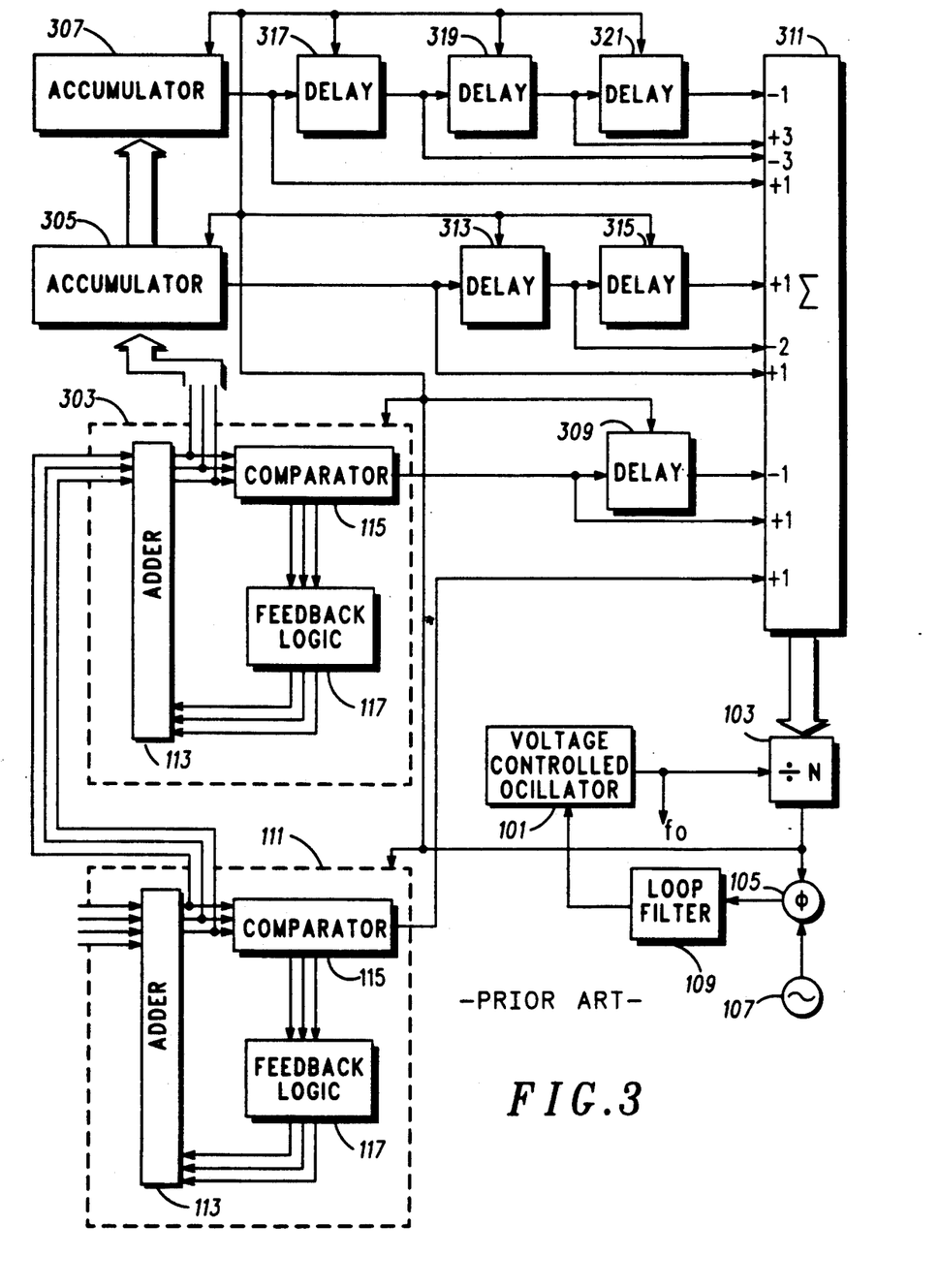
FIG. 3 is a block diagram of a multiple order ripple fractional-N synthesizer.

In a multiaccumulator system, the contents of the first accumulator 111 becomes the Data input to the second accumulator 303. The contents of the second accumulator 303 becomes the data input to the third accumulator 305. Once the data is set at the output of adder 113 of accumulator 111, it must be transferred to the data input of adder 113 of accumulator 303. Once the data is set at the output of adder 113 of accumulator 303, it must be transferred to the data input of accumulator 305, etc. All of the transfer must be accomplished in one clock pulse (which is typically derived from the output of frequency divider 103). This process has been termed a "ripple" process, and the accumulators are known as "ripple" accumulators. Obviously, an upper limit on the speed and/or the number of accumulators is imposed by the ripple process.

The second accumulator 303 has its own Z-transform quantization error, Q2, in addition to the error of, Q1, the first accumulator. However both of these errors will be greatly reduced from the single accumulator case. The carry-output from the second accumulator 303 is applied to a delay logic element 309 and, after the differentiation produced by delay element 309, is applied to adder 311. The carry output from the comparator of accumulator 305 is twice differentiated by delay logic elements 313 and 315 and input to adder 311. The carry output from the comparator of accumulator 307 is thrice differentiated by delay logic elements 317, 319, and 321 and input to adder 311. The carry outputs, differentiated as described are added and output as an effective carry-out signal to be applied to frequency divider 103. Thus, the effect produced by the multiple accumulator system is to add the first order phase offset of the carry-output of accumulator 111 and the second order phase offset of the differentiated carry-output of accumulator 303, the third order phase offset of the twice diffentiated carry output of accumulator 305, and the fourth order phase offset of the thrice differentiated carry output of accumulator 307 for the effective carry-out signal.

Figure 4:
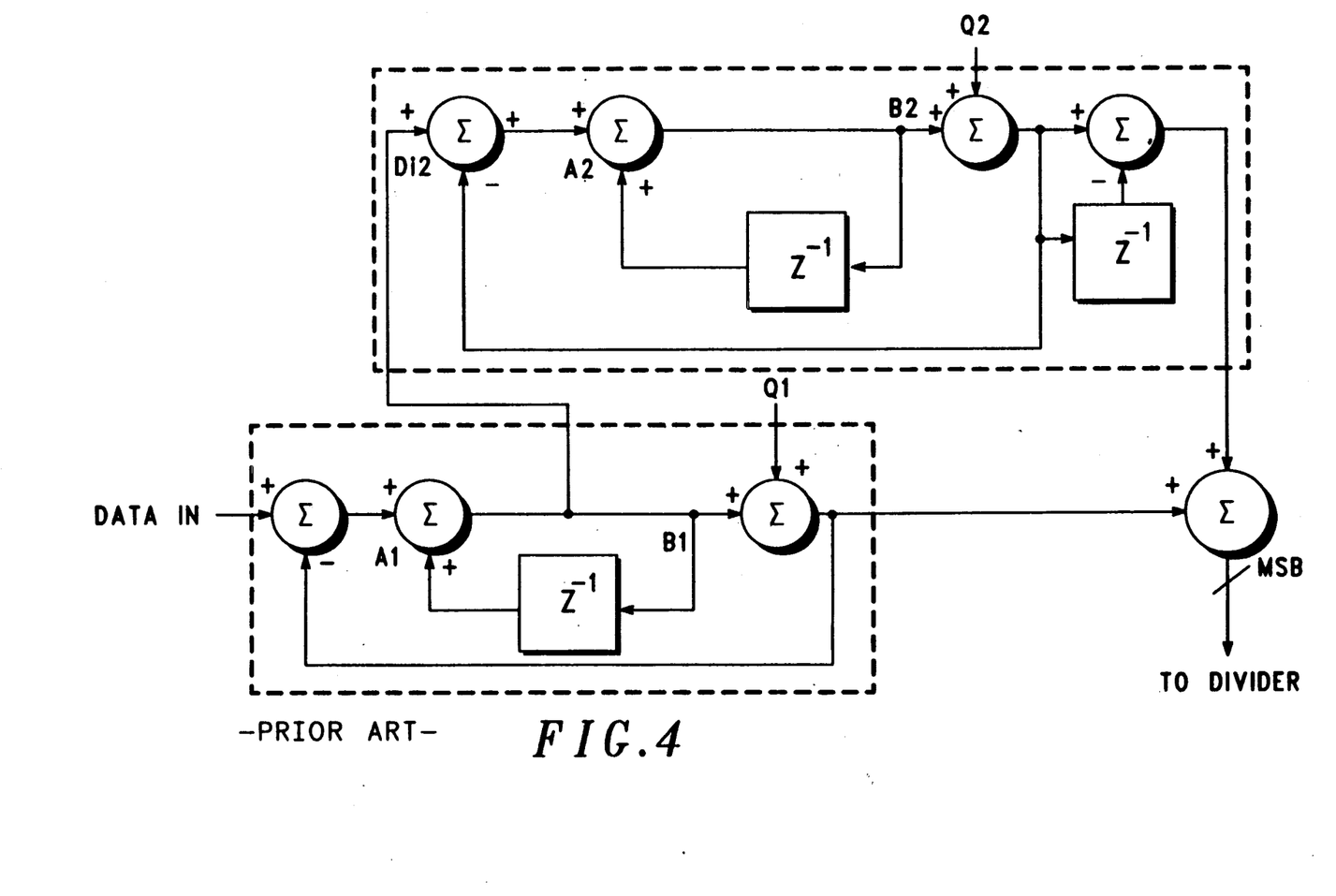
FIG. 4 is a Z-transform diagram equivalent of the digital network of a second order ripple accumulator.

For simplicity, the Z-transform model of the first and second accumulators is shown in the diagram of FIG. 4. DO1 is the Data out of the first accumulator. From the above calculation:

$$DO1 = \text{Data Out} = \frac{\text{Data In}}{(2-z^{-1})} + Q1\frac{(1-z^{-1})}{(2-z^{-1})}$$

Di2 is the accumulator contents of the first accumulator:

$$Di2 = \frac{(\text{Data In} - DO1)}{(1 - z^{-1})}$$

A similar equation to that above for DO2 is:

$$DO2 = \frac{Di2}{(2 - z^{-1})} + Q2 \frac{(1 - z^{-1})}{(2 - z^{-1})}$$

Substitution in the expression for Di2 and then substituting in for DO1:

$$DO2 = \frac{\text{Data In}}{(2 - z^{-1})(1 - z^{-1})} - Q1\left[\frac{1}{(2 - z^{-1})^2}\right] +$$

$$Q2\left[\frac{1 - z^{-1}}{2 - z^{-1}}\right] - \frac{\text{Data In}}{(2 - z^{-1})^2(1 - z^{-1})}$$

But: $DO3 = DO2(1 - z^{-1})$ and Data out $= DO1 + DO3$

Thus after some algebra:

$$\text{Data Out} = \text{Data In}\left[\frac{3 - 2z^{-1}}{(2 - z^{-1})^2}\right] +$$

$$Q1\left[\frac{(1 - z^{-1})^2}{(2 - z^{-1})^2}\right] + Q2\left[\frac{(1 - z^{-1})^2}{2 - z^{-1}}\right]$$

This representation is then converted to the frequency domain (Once again "v" is the frequency normalized to the folding frequency):

$$\left|\frac{\text{Data Out}}{\text{Data In}}\right| = \frac{\sqrt{13 - 12\cos(\pi v)}}{5 - 4\cos(\pi v)}$$

$$\left|\frac{\text{Data Out}}{Q1}\right| = \frac{2 - 2\cos(\pi v)}{5 - 4\cos(\pi v)}$$

$$\left|\frac{\text{Data Out}}{Q2}\right| = \frac{2 - 2\cos(\pi v)}{\sqrt{5 - 4\cos(\pi v)}}$$

In this case the high pass corner occurs at about the same frequency as in the one accumulator case but the frequency response of the high pass characteristic to the quantization noise is 40 db/decade. This allows the PLL to have a wider bandwidth, i.e., allows the fractional system to operate at a lower frequency, than in the one accumulator case while still maintaining the desired noise suppression.

The number of accumulators can theoretically be increased to any desired order. The resulting slope of the response of the high pass characteristic to the quantization noise will be the number of accumulators times 20 db/decade. The accumulators are "recombined" in what is known as a "Pascal's triangle method" as disclosed in U.S. Pat. No. 4,609,881. In general the higher order accumulators are recombined as $(1 - Z^{-1})^{(n-1)}$.

The aforementioned systems require that the data must ripple through all of the accumulators upon a clock pulse. For a higher order system this requirement limits the maximum accumulator clock rate and thus limits the noise suppression which can be obtained. The reason for this limit is that the propagation delay of each accumulator will add until the data cannot ripple through the system in one clock pulse period.

SUMMARY OF THE INVENTION

A fractional-N synthesizer accepts a digital number to select a controllable oscillator output signal frequency. The output signal frequency is divided by a loop divider which has a variable divisor controlled by a control input signal to create a feedback signal for comparison to a reference signal. The digital number is integrated and a latched output signal and a first carry output signal are generated upon a first occurrence of a produced clock signal. The latched output signal is integrated and a second carry output signal is generated upon a second occurrence of said clock signal. The first carry output signal and the second carry output signal is differentiated before they are combined to create the control input signal.

DETAILED DESCRIPTION OF THE PREFERRED EMBODIMENT

Figure 5:
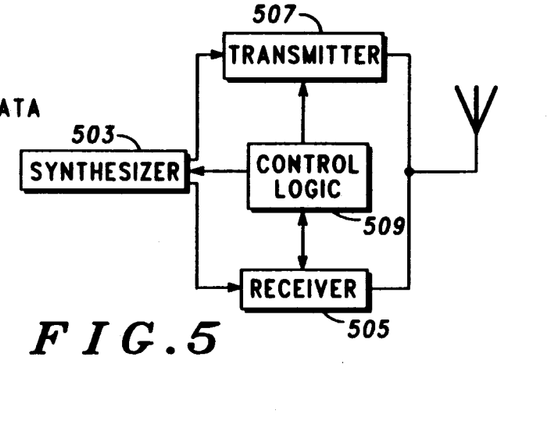
FIG. 5 is a block diagram of a radio transceiver which may employ the present invention.

A basic block diagram of a radio transceiver which may employ the present invention is shown in FIG. 5. Such a radio transceiver, preferably, is a digital radio transceiver useful in a digital radiotelephone system. The output of the synthesizer 503 is used by both the receiver 505 and the transmitter 507 to produce a local oscillator and a transmit signal, respectively. Control over functions of the transceiver, such as channel of operation frequency, is provided by control logic 509 function and is input to the first accumulator of a fractional-N synthesizer as Numerator data in.

Figure 6:
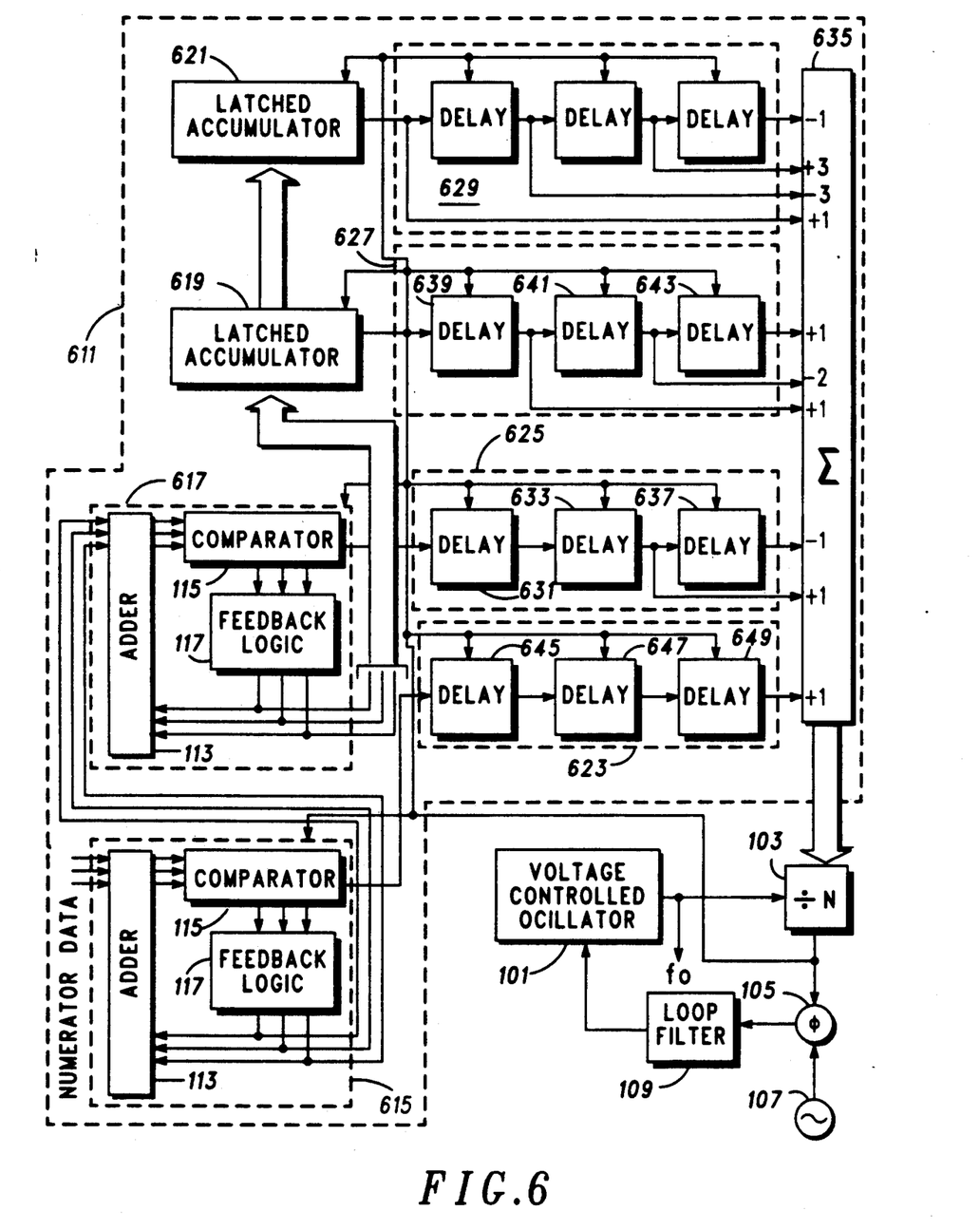
FIG. 6 is a block diagram of a multiple latched accumulator fractional-N synthesizer in accordance with the present invention.

A multiple latched accumulator fractional-N synthesizer is shown in FIG. 6. The frequency systhesizer utilizes a voltage controlled oscillator, VCO 101, which provides the desired output frequency fo, as well as feeds the input to a variable digital frequency divider circuit 103. The output of the variable frequency divider 103 feeds one input of a phase comparator circuit 105 with the other input being fed from a reference oscillator 107. The output of the phase comparator 105 is filtered to remove extraneous noise components by loop filter 109. The output of the loop filter 109 is then fed back to the control input of the VCO 101 such that the VCO 101 will adjust its output frequency $f_o$ to be equal to the frequency of the reference oscillator 107 times the digital division ratio of the frequency divide 103.

In the preferred embodiment, the division ratio, N, of the frequency divider 103 is varied with a periodic sequence such that the output frequency $f_o$ of the VCO 101 may be adjusted in frequency steps equal to a fraction of the frequency of the reference oscillator 107. This periodic sequence is generated by a multiple accumulator digital network 611. A digital network of four accumulators is shown in FIG. 6.

Numerator data, which corresponds to frequency offset and which may include modulation information, is input from frequency selection circuitry (not shown) and applied to the first adder 113 of accumulator 615. The data output from the first accumulator 615 is taken at the output of feedback logic 117, after processing by comparator 115. This data output is available after the clock input signal, derived from frequency divider 103, has clocked the accumulator 615. It is an important feature of the present invention that the data presented from one accumulator to the next is only transferred to the next accumulator in the string during one clock cycle thereby avoiding the problem of having to ripple through all accumulators during one clock pulse. Each accumulator beyond the first is fed with the contents of the next lower order accumulators. Each accumulator performs a digital integration of the contents of the accumulator of next lower order with the first accumulator 615 performing a digital integration of the input Numerator data. The second accumulator 617 performs a double integral of the input Numerator data, the third accumulator 619 performs a triple integral of the input Numerator data, and the fourth accumulator 621 performs a quadruple integral of the input Numerator data.

The output of each accumulator is the carry or overflow output. For the first accumulator 615 this output signifies that the output frequency $f_o$ of the VCO 101 has acquired 360 degrees of phase error relative to the frequency of the signal output from the reference oscillator 107. In order to correct this, the division ratio of the frequency divider 103 is increased by one integer for the next clock interval and the internal contents of accumulator 615 is reduced by it's capacity. This action effectively removes one cycle of the output frequency $f_o$ from the phase detector 105 input and thus results in a phase correction of 360 degrees at the VCO 101 output. This correction will occur only at the point the output frequency $f_o$ would achieve 360 degrees of phase error without a loop filter 109. Such a condition will result in a sawtooth type of waveform at the output of the phase detector 105 which must then be filtered by the loop filter 109. The average value of this sawtooth waveform is the correct control signal to select frequencies which are spaced at fractional increments of the reference frequency output from reference oscillator 107.

However, the internal contents of the first accumulator 615 represent the intermediate phase error. Higher order accumulators are included to operate on the internal contents of the first accumulator 615 to provide intermediate corrections to the phase error with the result that the sawtooth type of waveform can be subdivided in frequency, resulting in lower noise output at the fundamental frequency of the original sawtooth waveform.

The output of the higher order accumulators are fed through digital delay networks (623, 625, 627, 629 respectively), which perform derivatives of the carry outputs. Since these carry outputs of the accumulators are digital integrations of the Numerator data input, the net result is higher order corrections to the desired phase.

For example, the carry output of the second accumulator 617 is applied to digital delay network 625 where it is delayed by conventional delay element 631 and conventional delay element 633 prior to being fed to a conventional digital adder 635. In adder 635, the delayed output of second accumulator 617 is added to the negative of its previous value obtained from the output of conventional delay element 637. This is a first derivative in a digital sense. Since the output of the second accumulator 617 is the second integral of the input Numerator data, the net output of this arrangement is a second order phase correction of the fractional frequency offset. (Note that the Numerator data is a frequency offset which is the derivative of phase).

The carry output of the third accumulator 619 is applied to digital delay network 627 where it is delayed by delay element 639 and added to twice the negative of its previous value plus its second previous value. These previous values are obtained from the outputs of delay elements 641 and 643 respectively. This corresponds to a second order digital derivative. Since the output of the third accumulator 619 represents the third integral of the Numerator data input, the overall effect is a third order correction to the phase of the fractional frequency offset.

This technique may be carried out to the desired order of corrections by adding more accumulator sections to the digital network 611. The coefficients of the addition of each sequence correspond to the factors in the expansion of $(1-z^{-1})^X$, where X is the order of the accumulator under consideration. It is also possible to introduce other coefficients in which the sum of the coefficients are one for the first accumulator and zero for all higher order accumulators. However, any choice other than the above coefficients will result in less than optimum noise rejection performance.

Figure 7:
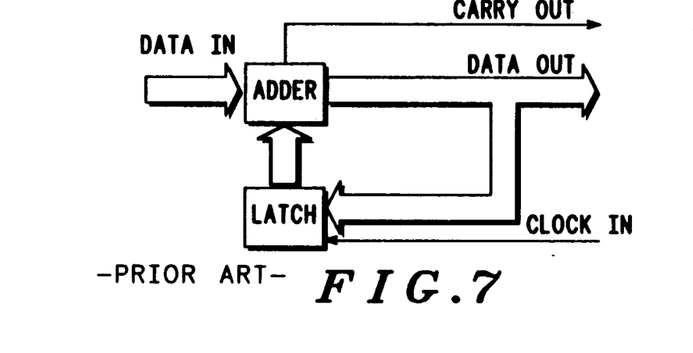
FIG. 7 is a block diagram detail of a delay adding, or ripple, accumulator structure.

In FIG. 7 a block diagram of a ripple accumulator is shown. If a plurality of these accumulators were cascaded, as illustrated in FIG. 3, such that the data output of one fed the data input of the next, then the resulting circuit would have a group of cascaded adders of depth equal to the number of accumulators. Such an arrangement would require a settling time equal to the delay of the addition process for one accumulator, times the number of accumulators. If a high order correction to the is desired, then a large number of accumulators will be required with a corresponding decrease in the maximum rate of operation.

Figure 8:
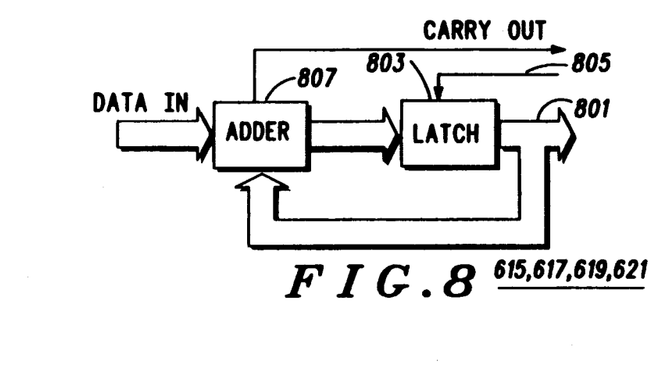
FIG. 8 is a block diagram detail of a non delay adding or latched accumulator structure which may be employed in the present invention.

In the preferred embodiment a latched accumulator configuration such as shown in FIG. 8 for accumulator 615, 617, 619, and 621 is employed. The data out signal 801 of each accumulator is taken as the latched output from conventional latch circuit 803. A cascade of such accumulators will only have a single adder delay upon the ocurrence of each clock pulse (which is applied via 805 to latch circuit 803) since the latch 803 isolates the associate adder 807. This arrangement results in each accumulator carry output sequence from adder 807 being delayed by one clock cycle from the output sequence of the next lower order accumulator.

Referring again to FIG. 6 in a four accumulator system, for example, the fourth accumulator 621 carry output sequence applied to digital network 629 will be delayed three cycles from the first accumulator 615 carry output sequence, the third accumulator 619 carry output sequence will be delayed two cycles from the first accumulator 615 carry output sequence, and the second accumulator 617 carry output sequence will be delayed one cycle from the first accumulator 615 carry output sequence. In order to align the sequences in time, the output of the first accumulator 615 is delayed three times by the delay elements 645, 647, and 649, the output of the second accumulator 617 is delayed twice by delay elements 631 and 633, and the output of the third accumulator 619 is delayed once by delay element 639. All other delays are associated with the digital differentiation processes.

Figure 9:
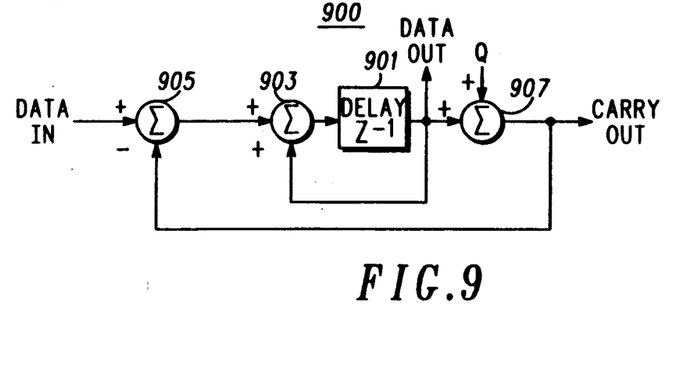
FIG. 9 shows a Z-transform diagram equivalent of the latched accumulator in FIG. 8.

In order to demonstrate the necessity for speed of operation, an equivalent model 900 of a latched accumulator and associated digital delay network suitable for analyzing the noise performance of the digital network is presented in FIG. 9. This model, based on conventional Z transform theory, represents the latch operation as a digital delay or $z^{-1}$ gain block 901. The adder in the accumulator is represented by the adder block 903 associated with the delay block 901. A second adder block 905 is used in the outer loop to represent the substraction of the accumulator capacity which occurs every time the accumulator overflows. Finally a third adder block 907 is used to represent the noise caused by the quantization of the phase error.

Two transfer functions can be defined for this accumulator structure:

Carry OUT = $z^{-1}$•Data IN + $(1-z^{-1})Q$

Data OUT = DATA IN Next = $z^{-1}$•Data IN − $z^{-1}$•Q

Figure 10:
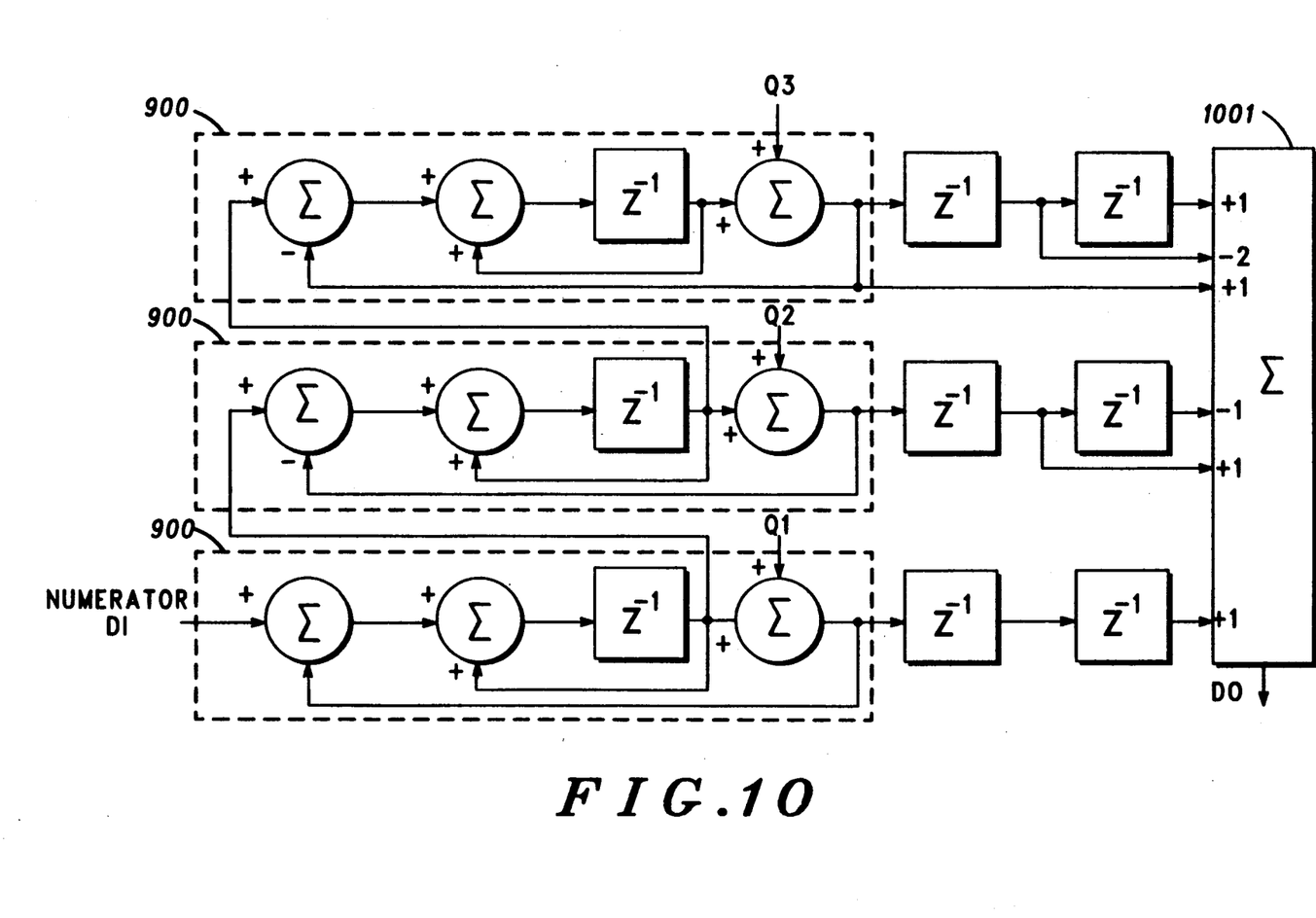
FIG. 10 is the Z-transform diagram equivalent of a three accumulator system in accordance with the present invention.

For simplicity, three latched accumulators and associated delay networks, representing the lowest order three of FIG. 6, are shown in the Z-transform diagram equivalent of FIG. 10. The carry output of each higher order accumulator is passed through a corresponding number of digital derivatives and then recombined in a common adder 1001. Each lower order accumulator output is delayed to realign all sequences. An overall transfer function for this system may be derived as shown below:

$DO = z^{-3}(3 - 3z^{-1} + z^{-2})DI + z^{-2}(1-z^{-1})^3 Q1 + z^{-1}(1-z^{-1})^3 Q2 + (1-z^{-1})^3 Q3$

This expression may be converted back to the frequency domain by the substitution $e^{j\pi v} = z$. This results in the following expression for DO. (Note that this is a term-by-term magnitude expression.)

$DO =$ $\sqrt{\begin{array}{l}\{19 + 6(\cos 2\pi v - 3\cos\pi v - \cos\pi v \cos 2\pi v - \\ \sin 2\pi v + 3\sin\pi v - \sin\pi v \sin 2\pi v + \cos\pi v \sin 2\pi v - \\ 3\cos\pi v \sin\pi v + \cos 2\pi v \sin\pi v \{\cos 2\pi v \sin 2\pi v)\}\end{array}}$ DI +

$[2 - 2\cos\pi v]^{\frac{3}{2}} Q1 + [2 - 2\cos\pi v]^{\frac{3}{2}} Q2 + [2 - 2\cos\pi v]^{\frac{3}{2}} Q3$ In the above expression v is frequency normalized to the folding frequency. The folding frequency is equal to one half the rate at which the accumulator clocks operate.

Figure 11:
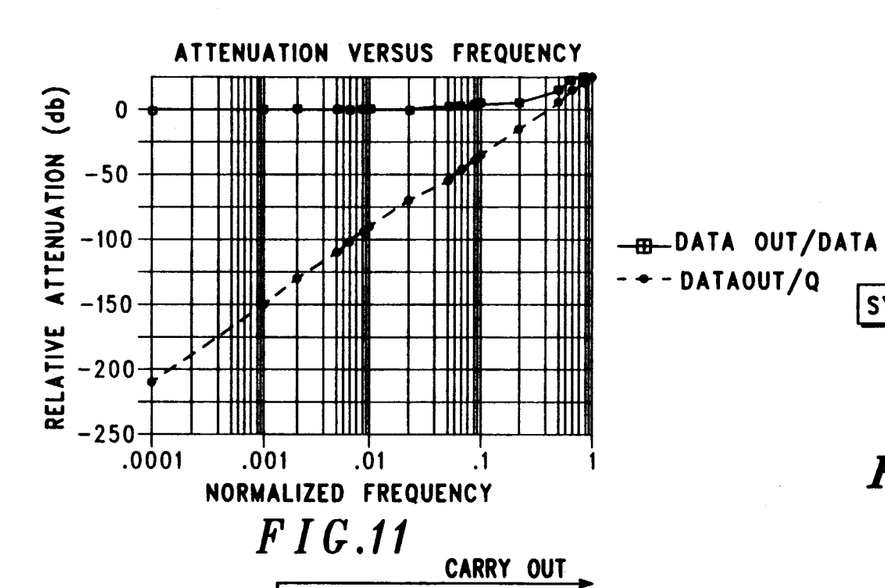
FIG. 11 shows the attenuation due to the digital network of the data in and the quantization noise terms for a three accumulator system.

The frequency versus attenuation curve of FIG. 11 shows the output of each term of this expression. Note that the DI (or data in) is slightly distorted at high frequencies to the data out (DO) and each of the quantization noise terms (Q) are high pass filtered. The high pass term rolls off with a slope of 60 db/decade and the corner of the high pass occurs at about one half the folding frequency.

Two results can be interpreted from FIG. 11. First of all the desired frequency offset data is passed through the digital network with low distortion. Secondly, it can be seen that for each added accumulator the noise rejection of the digital network at low frequencies is improved since the slope of the high pass characteristic to the quantization noise will be 20 times the number of accumulators in db per decade. In addition the digital network should be operated at as high a rate as possible such that the corner of the high pass characteristic will be at as high a frequency as possible. If the low frequency noise is properly rejected in the digital network then the overall synthesizer can be made low noise because the phase locked loop which the digital network feeds is a low pass network which will reject any residual higher frequency noise components which are not rejected by the digital network.

In the preferred embodiment, modulation information is applied to the multiaccumulator digital network 611 of the fractional-N synthesizer as the sixteen least significant bits of a twenty-four bit number Numerator data input from the transceiver control logic 509. Since a transceiver which employs the present invention may be effectively utilized in the GSM pan-European digital radiotelephone system, rapid frequency changes, modulation, and low spurious and noise levels are realized with a fractional-N synthesizer. For modulation, the fractional-N synthesizer employs a look-up table to convert the data stream to be transmitted into frequency offsets for the fractional-N synthesizer. The loop division of the synthesizer is adjusted in accordance with the input data stream to follow the instantaneous frequency offset required for the GMSK modulated signal. This can be at the offset frequency or directly at the main frequency.

The latched accumulator fractional-N synthesizer configuration is operated upon with large accumulators to eliminate spurious signals, to provide D/A correction to reduce discrete spurious signals, and to provide direct digital modulation to the PLL. In the GSM system, the data rate is 270.83333 kb with a BT product of 0.3. This results in in a frequency of about 81 kHz which must be passed with low distortion through the PLL as modulation.

The actual frequency offset components of the GMSK signal range from 10 Hz to about 70 kHz. This range determines the length of the accumulators as it will be necessary to use synthesizer steps of less than 10 Hz. In the preferred embodiment of the GSM system, with a reference frequency of 26 MHz, the accumulator length is 24 bits but, as a minimum, must be at least 22 bits.

Obviously, the desired instantaneous frequency offsets due to the modulation are well below the cutoff of the loop filter. Therefore the frequency synthesizer loop does not attenuate any of the fundamental frequency "channelization" spurious signals due to the modulation. However, with a multiple accumulator system this problem is overcome.

It is possible, and preferable, to increase the fractionalization (the value of the denominator of the fractional part of the division) such that all spurious outputs are moved to very low frequencies where the combined effects of using many accumulators at a high rate of clock speed results in a large attenuation of the quantization noise of the fractional process. Thus, a large denominator effectively divides the frequency of the reference oscillator such that spurious signals which are produced fall well below the three decibel corner of the loop high pass characteristic. Using many accumulators increases the slope of the high pass filtering action. Increasing the rate of operation moves the corner frequency of the high pass filter up in frequency.

Referring again to the block diagram of the latched accumulator fractional-N synthesizer of FIG. 6, the output of the fractional-N multiple accumulator digital network 611 is fed to the division control input of the frequency divider 103. When network 611 causes the division to increase by one for one clock reference period, one output pulse of the VCO 101 is effectively removed by the frequency divider 103. This action corresponds to a phase shift of $2\pi$ radians at the output frequency of the VCO 101. This phase shift is then divided by the frequency divider 103 such that the phase shift at the phase detector 105 input is $2\pi$ radians divided by the divisor of the frequency divider 103. In general the network 611 generates a time-varying division ratio. Thus in the general case the input to the phase detector 105 may be represented as follows:

$$\frac{2\pi}{sN_L}c(n)$$

where:
$N_L$ is the nominal loop division ratio
$c(n)$ is the Fourier component of the digital sequence at the offset frequency and:
$1/s$ is introduced to convert frequency to phase The Fourier components of the digital sequence are calculated as follows:

$$c(n) = \frac{2}{N}\sum_{i=0}^{N-1}\theta(i)\left[\cos\left(\frac{2\pi i}{N}\right) - j\sin\left(\frac{2\pi i}{N}\right)\right]$$

where:
N is the total number of points in one period of the sequence
$\theta(i)$ is the time waveform of the digital sequence
i is the time component and:
n is the frequency component.

After passing through the phase detector 105 the signal is then input to the loop filter 109. The output of the loop filter 109 feeds the control input of the VCO 101. The magnitude of the controlling error voltage at the input of the VCO 101 is expressed as follows:

$$V_e = \frac{2\pi K_\phi |c(n)| |F(\omega)|}{N_L}$$

where:
$K_\phi$ is the phase detector conversion gain and:
$|F(\omega)|$ is the magnitude of the filter response at the offset frequency This control voltage will cause the VCO 101 to output a spurious component as follows:

$$f_{spur}(t) = \frac{2\pi K_\phi K_v}{N_L}|F(\omega)||c(n)|\cos(\omega_m t)$$

where:
$\omega_m$ is the spurious frequency component of the digital sequence and:
$K_v$ is the conversion gain of the variable oscillator.

The feedback nature of the phase locked loop will correct this such that the spurious component will be as follows:

$$f_{spur}(t) = \frac{\frac{2\pi K_\phi K_v}{N_L}|F(\omega)||c(n)|\cos(\omega_m t)}{1 + \frac{K_\phi K_v |F(\omega)|}{\omega_m N_L}}$$

For small spurious components the spur level may be approximated as $\beta/2$ where $\beta$ is the phase corresponding to the frequency derived above.

$$\beta = \int f_{spur}(t) dt$$

The spurious levels may thus be approximated as follows:

$$\frac{\beta}{2} = \frac{\frac{\pi K_\phi K_v}{N_L \omega_m}|F(\omega)||c(n)|}{1 + \frac{K_\phi K_v |F(\omega)|}{\omega_m N_L}}$$

for low frequencies $F(\omega) \to \infty$ and $\omega_m \to 0$. Thus the spurious level can be approximated as follows:

$$\frac{\beta}{2} = 2\pi |c(n)|$$

Thus, if the Fourier components of the multiple accumulator digital network 611 are shaped such that all spurious components are small valued, then the output of the phase locked loop will also contain small spurious values. The network 611 behaves as a high pass filter to the quantization noise. By increasing the fractionalization to a very large number all spurious signals will be located at frequency offsets where the fractional sequence generator attenuates the spurious levels to below that of the noise floor of the phase locked loop. After passing to the phase locked loop output, the spurious signals still retain the level established by the fractional sequence generator.

In the preferred embodiment, the phase detector operates at 26 MHz supplied by reference oscillator 107, and fractionalization is by a large number.

($2^{24}$=16,777,216.) The fractional-N spurious signals occur at harmonics and subharmonics of 1.54972 Hertz. Since the reference is at a very high frequency, the high pass corner of the fractional-N multiple accumulator digital network 611 occurs at about 6.5 MHz. The attenuation of spurious signals caused by the fractionalization is, therefore, extremely large.

Elimination of spurious signals by the use of network 611 high pass nature has important advantages. First, the channel spacing is much smaller than the minimum required frequency step for low distortion modulation. Second, the loop bandwidth is extremely wide since there are no discrete spurious signals above the noise floor of the phase locked loop which need to be rejected. (Except for the spur at the actual reference which is 26 MHz). In the preferred embodiment, an open loop unity gain frequency of 400 kHz causes a 5 degrees peak and 3.5 degrees RMS phase error to the GMSK signal. This is reasonable limit given the GSM specifications of 20 degrees peak and 5 degrees RMS. The RMS value of 3.5 degrees is very reliable in that it is determined by the wide loop bandwidth.

A problem could develop with a system designed for very high fractionalization in that some channel offsets would result in a common factor of the numerator and denominator. This would result in an effective fractionalization which is much less than that desired and the discrete spurious signals would re-appear. This situation can be avoided by setting the least significant bit of the accumulator. As an example consider the above situation in which a channel requires a fractional offset of $\frac{1}{4}$. This would result in spurious outputs at harmonics and subharmonics of 6.5 MHz. If the LSB is set the the fractionalization will become 4,194,305/16,777,216 which will move the spurious signals back to the 1 Hz region. This will result in a small frequency error, but for most cases this kind of error is insignificant.

A second method of ensuring high fractionalization is to initially offset the accumulators with a number, or group of numbers, and then input the desired frequency data. This initial offset will cause a fractional-N accumulator which contains two or more internal accumulators to generate a spurious pattern corresponding to that of its full accumulator length for almost any value of the input data. In a multiple accumulator system the initial offset of the bottom bit (or bits) will result in an essentially random pattern imposed on the offset data. This method will not cause a frequency error since the initial offset is removed once the data is fed into the system. Note that this method will not work for a single accumulator system because in a single accumulator system the waveform corresponds to a simple sawtooth which will return to the same waveform regardless of the initial offset. With many accumulators the offset will set up a multitude of patterns which will interact to form very long time sequences with correspondingly low frequency spectral components which will be rejected in the digital network 111.

Thus, given an $n^{th}$ order fractional N system, the accumulators may be "latched" resulting in a synchronous system in which data does not need to ripple through more than one accumulator in one clock cycle. The first, or lowest order, accumulator output to the variable loop divider is delayed by n-1 clock units, the next lowest level accumulator is delayed by n-2 clock units and so on until the last, or highest level, accumulator which is not delayed. This realigns the time sequences to allow the noise performance of a non-latched system.

Because of the synchronous nature of the system, it is able to operate at higher frequencies and thus allow the PLL bandwidth to be larger. This allows faster lock times and wideband digital modulation through the fractional divider (or analog modulation through the reference oscillator input to the phase detector.) while maintaining superior and predictable spurious performance.

We claim:

1. A fractional-N synthesizer which accepts a digital number of a plurality of bits to select a controllable oscillator output signal frequency and which divides the output signal frequency by a loop divider, the loop divider having a variable divisor controlled by a control input signal to create a feedback signal to be compared to a reference signal, the fractional-N synthesizer comprising:

means for producing a clock signal;
   means for integrating the digital number and generating a latched output signal and a first carry output signal on a first occurrence of said clock signal;
   means for integrating said latched output signal and generating a second carry output signal on a second occurrence of said clock signal;
   means for delaying said first carry output signal until said second occurrence of said clock signal;
   means for differentiating said second carry output signal; and
   means for combining said delayed first carry output signal and said differentiated second carry output signal to create the control input signal.

2. A fractional-N synthesizer in accordance with claim 1 further comprising means for modulating the output signal by time varying at least one bit of said digital number.

3. A fractional-N synthesizer in accordance with claim 1 wherein the variable divisor has an average value represented by the sum of an integer and a quotient of a numerator divided by a denominator.

4. A fractional-N synthesizer in accordance with claim 3 wherein said denominator of the variable divisor is of a large value such that the frequency of the quotient of the reference signal divided by said denominator is much less than the corner frequency of a highpass characteristic of the fractional-N synthesizer whereby spurious signals in the output signal are rejected.

5. A fractional-N synthesizer in accordance with claim 3 further comprising means for maintaining said denominator for a multiplicity of numerator values by selecting a predetermined state for at least one bit of said digital number.

6. A radio transmitter employing a fractional-N synthesizer which accepts a digital number of a plurality of bits from a controller to select a frequency for an operating signal and which divides the operating signal frequency by a loop divider, the loop divider having a variable divisor controlled by a control input signal to create a feedback signal to be compared to a reference signal, the radio transmitter comprising:

means for producing a clock signal;
   means for integrating the digital number and generating a latched output signal and a first carry output signal on a first occurrence of said clock signal;

means for integrating said latched output signal and generating a second carry output signal on a second occurrence of said clock signal;

means for delaying said first carry output signal until said second occurrence of said clock signal;

means for differentiating said second carry output signal;

means for combining said delayed first carry output signal and said differentiated second carry output signal to create the control input signal;

means, responsive to the control input signal, for generating the operating signal; and means for transmitting the operating signal.

7. A radio transmitter in accordance with claim 6 further comprising means for modulating the operating signal by time varying at least one bit of said digital number.

8. A radio transmitter in accordance with claim 6 wherein the variable divisor has an average value represented by the sum of an integer and a quotient of a numerator divided by a denominator.

9. A radio transmitter in accordance with claim 8 wherein said denominator of the variable divisor is of a large value such that the frequency of the quotient of the reference signal divided by said denominator is much less than the corner frequency of a highpass characteristic of the fractional-N synthesizer whereby spurious signals in the operating signal are rejected.

10. A radio transmitter in accordance with claim 8 further comprising means for maintaining said denominator for a multiplicity of numerator values by selecting a predetermined state for at least one bit of said digital number.

11. A method of signal synthesis in a fractional-N synthesizer which accepts a digital number of a plurality of bits to select a controllable oscillator output signal frequency and which divides the output signal frequency by a loop divider, the loop divider having a variable divisor controlled by a control input signal to create a feedback signal to be compared to a reference signal, the method comprising the steps of:

producing a clock signal;

integrating the digital number and generating a latched output signal and a first carry output signal on a first occurrence of said clock signal;

integrating said latched output signal and generating a second carry output signal on a second occurrence of said clock signal;

delaying said first carry output signal until said second occurrence of said clock signal;

differentiating said second carry output signal; and combining said delayed first carry output signal and said differentiated second carry output signal to create the control input signal.

12. A method in accordance with the method of claim 11 further comprising the step of modulating the output signal by time varying at least one bit of said digital number.

13. A method in accordance with the method of claim 11 wherein the variable divisor has an average value represented by the sum of an integer and a quotient of a numerator divided by a denominator and wherein said denominator of the variable divisor is of a large value such that the frequency of the quotient of the reference signal divided by said denominator is much less than the corner frequency of a highpass characteristic of the fractional-N synthesizer, further comprising the step of rejecting spurious signals in the output signal.

14. A method in accordance with the method of claim 13 further comprising the step of maintaining said denominator for a multiplicity of numerator values by selecting a predetermined state for at least one bit of said digital number.

* * * * *